United States Patent [19]
Cherng

[11] Patent Number: 5,304,433
[45] Date of Patent: Apr. 19, 1994

[54] CAPACITY INDICATOR FOR LEAD-ACID BATTERIES

[75] Inventor: Jing-Yih Cherng, Eagan, Minn.

[73] Assignee: GNB Battery Technologies Inc., Mendota Heights, Minn.

[21] Appl. No.: 952,358

[22] Filed: Sep. 28, 1992

[51] Int. Cl.$^5$ .......................................... H01M 10/48
[52] U.S. Cl. ...................................... 429/91; 429/228
[58] Field of Search ........................ 429/91, 92, 228

[56] References Cited

U.S. PATENT DOCUMENTS

| | | | |
|---|---|---|---|
| 2,000,668 | 5/1935 | Pease | 136/182 |
| 3,451,857 | 6/1969 | Christian | 136/182 |
| 3,560,268 | 2/1971 | Winsel | 136/182 |
| 3,659,193 | 4/1972 | Pitsch | 324/29 |
| 4,045,721 | 8/1977 | Swain | 320/43 |
| 4,126,735 | 11/1978 | Fritts | 429/91 |
| 4,129,824 | 12/1978 | Howes | 324/29.5 |
| 4,180,770 | 12/1979 | Eby | 324/429 |
| 4,217,645 | 8/1980 | Barry | 364/483 |
| 4,284,951 | 8/1981 | Dahl et al. | 324/430 |
| 4,328,490 | 5/1982 | Usuba et al. | 340/715 |
| 4,417,608 | 11/1983 | McCartney | 429/225 |
| 4,678,999 | 7/1987 | Schneider | 324/427 |
| 4,689,571 | 8/1987 | Yonezu | 324/432 |
| 4,740,754 | 4/1988 | Finger | 324/428 |
| 4,949,046 | 8/1990 | Seyfang | 324/427 |
| 4,968,942 | 11/1990 | Palanisamy | 324/430 |

FOREIGN PATENT DOCUMENTS

| | | |
|---|---|---|
| 2462039 | 10/1975 | Fed. Rep. of Germany . |
| 3331360 | 3/1985 | Fed. Rep. of Germany . |
| 0001471 | 1/1981 | Japan . |
| 59-94381 | 5/1984 | Japan . |
| 59-186277 | 10/1984 | Japan . |
| 60-112265 | 6/1985 | Japan . |
| 60-262367 | 12/1985 | Japan . |

Primary Examiner—José G. Dees
Assistant Examiner—Samuel Barts
Attorney, Agent, or Firm—Leydig, Voit & Mayer

[57] ABSTRACT

A lead-acid battery with a charge capacity indicator comprises a sensor that includes a reversible electrode, such as $PbO_2$, as a reference electrode that does not participate in the battery charge and discharge reactions, and the voltage is measured between the reference electrode and the negative plates, for example, by using the negative terminal.

14 Claims, 11 Drawing Sheets

CAPACITY INDICATOR FOR LEAD-ACID BATTERIES

FIELD OF THE INVENTION

This invention relates to lead-acid batteries and, more particularly, to a capacity indicator for such batteries.

BACKGROUND OF THE INVENTION

It has long been recognized that it would be highly desirable to have a reliable means of determining the capacity of lead-acid batteries. Over the years, a considerable amount of effort has been directed to providing an economical, yet accurate, means of indicating the capacity of lead-acid batteries.

It has been recognized, that, in lead-acid batteries, the average concentration of the bulk electrolyte is proportional to the capacity of such a battery. Sulfuric acid is thus involved in the following electrochemical reaction in lead-acid batteries:

$$Pb + PbO_2 + 2H_2SO_4 \rightleftharpoons 2PbSO_4 + 2H_2O$$

Accordingly, as may be seen from the above-identified electrochemical reaction, the specific gravity of the electrolyte is raised and lowered as the battery is charged and discharged, respectively.

While simple in principle, the measurement of the average acid concentration in lead-acid batteries is complicated by the size of batteries, acid stratification, and the corrosive battery environment itself. For example, acid concentration gradients or stratification occurs when lead-acid batteries are charged or discharged. Accordingly, measurements can easily have more than 30% error if just the top part of the sulfuric acid is used in determining the specific gravity. Indeed, under certain conditions, an error of the magnitude of anywhere from 50 to 100% can result.

Ideally, perhaps, the open circuit voltage could be used as an indication of the specific gravity of the electrolyte. Unfortunately, however, the use of the open circuit voltage of a lead-acid battery does not give an accurate indication of the average bulk acid concentration unless the acid is destratified by vigorously gassing or by the use of other mechanical means, and the $PbO_2$ plates are also stabilized for a long period of time.

U.S. Pat. No. 3,659,193 to Pitsch et al. measures the concentration of an electrolyte by utilizing two electrodes immersed in the electrolyte. U.S. Pat. No. 4,045,721 to Swain discloses, what is termed, a proportional electric comparator of strong electrolytes. A sensor is made by placing a sensor electrode in a sensed electrolyte, and a reference electrode in a stable electrolyte, and electrically connecting the electrolytes with a capillary-joining electrolyte. This sensor is ordinarily constructed so that its electrical resistance is proportional to the resistivity of the joining electrolyte.

U.S. Pat. No. 4,129,824 to Howes discloses an electronic hydrometer for monitoring the specific gravity of a solution. This hydrometer includes a probe having spaced apart electrodes that are adapted to be inserted into the solution to be monitored and is provided with A.C. resistance electrically connected in series with an electrode of the probe to form, with the probe, a voltage divider network.

U.S. Pat. No. 4,689,571 to Yonezu et al. describes, by way of background, various types of specific gravity sensors that have been developed which provide an output that changes according to changes in the specific gravity of the electrolyte, as well as what are considered to be the disadvantages of those various types. Yonezu et al. disclose a lead electrode and a lead dioxide electrode which are immersed in the electrolyte, and the potential between those electrodes is converted to data indicative of the specific gravity of the electrolyte. A method for stabilizing the potential of the electrodes used is likewise disclosed.

Despite all of the substantial prior efforts in this field, there still exists the need for a reliable and efficient means for determining the capacity of a lead-acid battery. Accordingly, a principal object of the present invention is to provide a lead-acid battery having a reliable and efficient capacity indicator. A more specific object provides a battery including an indicator which can reliably and rapidly determine the average specific gravity of the electrolyte in the battery.

Another object of this invention provides a lead-acid battery having a capacity indicator whose accuracy is essentially independent of the extent of acid stratification within the battery.

Yet another object lies in the provision of a capacity indicator that can be readily and economically incorporated into existing commercial lead-acid battery configurations.

A still further object of the present invention is to provide a capacity indicator that will be operable over the expected life of a lead-acid battery.

Another and more specific object of the present invention is to provide a capacity indicator that may be utilized with a sealed lead-acid battery.

Yet another object of this invention provides a capacity indicator allowing the dynamic measurement of the capacity of a lead-acid battery.

An additional object of this invention lies in the provision of a direct electrical signal output to an electrical instrument for controlling the charging and/or discharging of lead-acid batteries.

Other objects and advantages of the present invention will become apparent as the following description proceeds.

SUMMARY OF THE INVENTION

In general, the present invention is predicated on the discovery that, while it takes a relatively long time for a $PbO_2$ electrode to establish an equilibrium under open circuit voltage conditions, the lead plates in a lead-acid battery have relatively fast acid transport and kinetics so that such plates can be used to determine the linear average acid concentration. To this end, in accordance with the present invention, that linear average acid concentration information is extracted by employing, in one of the battery cells, a reference electrode which does not participate in the battery charge and discharge reactions. In this fashion, the capacity of a battery can be calculated from the voltage reading in an instantaneous fashion in accordance with the well-known Nerst equation. In the preferred embodiment, the reference electrode is positioned in the negative terminal cell, and the voltage is measured between the reference electrode and the negative plates in the negative terminal cell.

While the invention is susceptible of various modifications and alternative forms, the specific embodiments thereof will hereinafter be described in detail. It should be understand, however, that it is not intended to limit the invention to the particular forms disclosed, but, on the contrary, the intention is to cover all modifications, equivalents and alternatives falling within the spirit and scope of the invention as expressed in the appended claims.

DETAILED DESCRIPTION OF THE INVENTION

Figure 1:
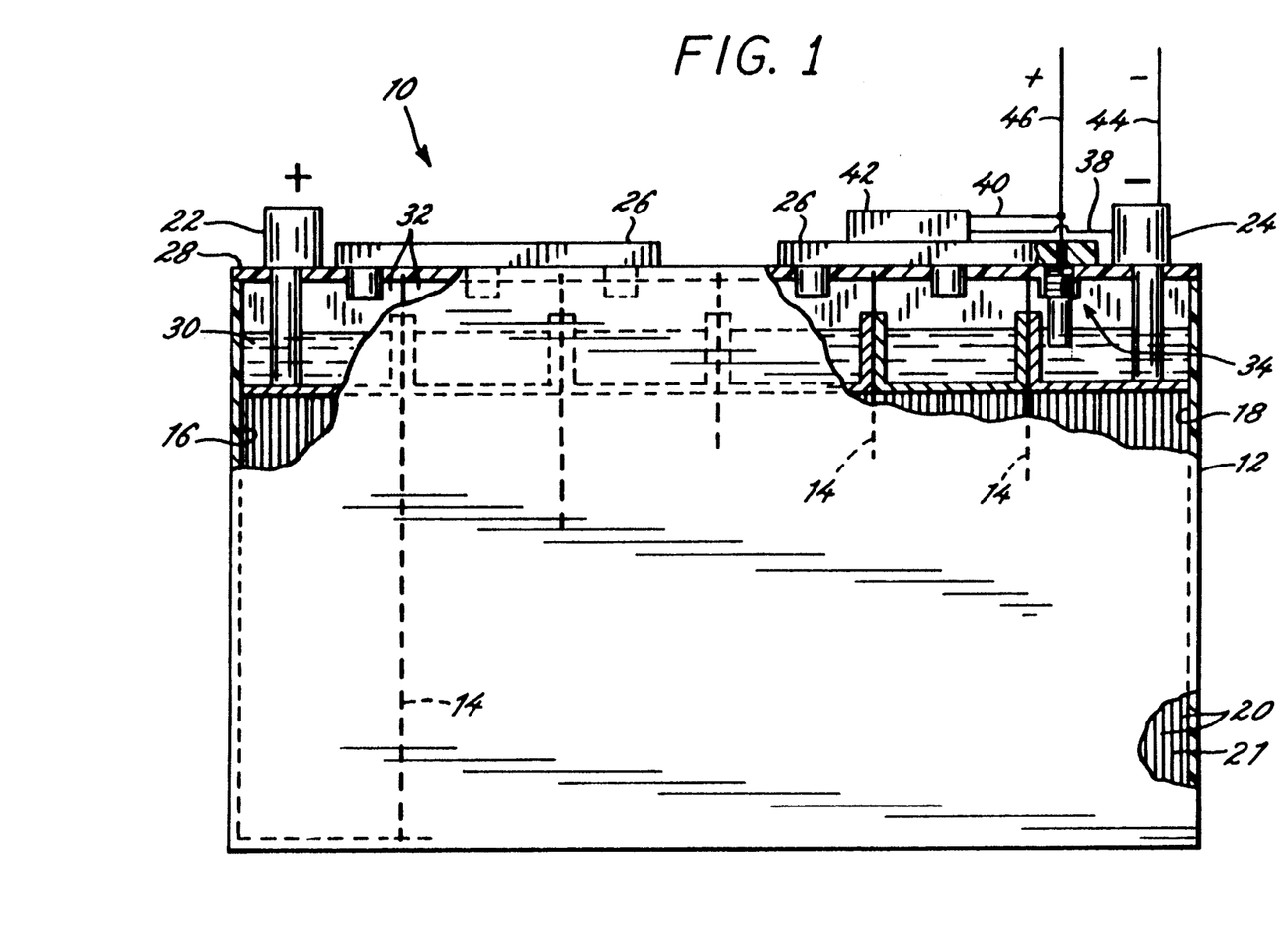
FIG. 1 is a side elevation view of a lead-acid battery in accordance with the present invention and having the container partially broken away so as to show the positioning in the battery of a capacity-indicating sensor.

FIG. 1 illustrates a schematic view of a battery in accordance with the present invention, incorporating a sensor indicative of the battery capacity. Thus, as shown, a battery generally indicated at 10, includes a container 12 that is divided into a series of cells by partitions 14. One end cell comprises the positive terminal cell 16, and the other end cell is the negative terminal cell 18. Each cell has positioned therein alternatively positioned negative and positive plates, shown generally at 20 with suitable separators 21 positioned therebetween.

In the positive terminal cell 16, the positive plates are connected to an exterior positive terminal 22. Similarly, in the negative terminal cell 18, the negative plates are connected to a negative terminal 24.

Conventional gang vents 26 are positioned on a cover 28. The electrolyte 30 in the battery is at a level above the height of the plates in headspace 32 within the container 12.

It should be appreciated that the design of the lead-acid battery in FIG. 1 (apart from the capacity indicator of the present invention) is not only conventional but is solely for the purpose of illustrating an exemplary embodiment. The sensor utilized in the present invention may be used with any lead-acid battery.

In accordance with the present invention, a sensor shown generally at 34 is incorporated in a battery 10 to provide a reliable and fast determination of the capacity of the battery by utilizing the average specific gravity of the bulk electrolyte. To this end, as is shown in the illustrative embodiment, the sensor 34 is positioned within the battery in the electrolyte 30, using gang vent 26, mounted in place with a plastic plug 36. If desired, the plastic plug 36 may be designed to screw into the vent hole, as in the illustrative embodiment shown in FIG. 2. Any means of locating and holding the sensor 34 in place may be utilized. Further, any hole in the cover may be utilized for positioning sensor 34 in the battery. Indeed, if desired, the cover 28 could be designed with a special hole sized to accommodate sensor 34.

The voltage output, indicative of the capacity of the battery, can be utilized, as may be desired. Thus, for example, leads 38 and 40 from the negative electrode 24, and from the sensor 34, respectively, may be connected to a conventional LCD display 42. Alternatively, or in addition, leads 44 and 46 may be connected to a charger or a vehicle electrical control system, which may use the state of charge information, so that the battery capacity is displayed on the instrument panel (or the like) of the automobile or other vehicle.

Thus, having a reliable indication of the state of charge of a lead-acid battery allows a wide variety of functions to be managed. As one example, the present invention could be connected to instrumentation that would provide effective charge management of the vehicle battery.

As a further example, use of this invention would allow a warning signal to be displayed on the instrument panel of the vehicle (as, for example, by using a conventional LED) so as to signal the need for changing the battery, or would allow the relative state-of-charge to be displayed. Indeed, when used in an electric vehicle or the like, the present invention could function in a somewhat similar fashion to a gas gauge in a conventional automobile or the like. A wide variety of other applications can be envisioned, given the reliability of the charge capacity indicator used in the present invention.

While the illustrative embodiment shows the sensor positioned in the negative terminal cell, it should be appreciated that the sensor could be placed in any other cell, if desired, utilizing a negative plate or plates in the selected cell. It has, however, been found convenient to utilize the negative terminal cell inasmuch as use of the negative terminal eliminates the need for the wiring that would be needed if any other cell were employed.

Indeed, the present invention is predicated on the assumption that the average specific gravity of the sulfuric acid electrolyte in the negative terminal cell will be representative of the specific gravity of the electrolyte in the other cells. This assumption will be satisfactory for most applications. However, as may be appreciated, and if it is desired, sensors can be placed in more than one cell if the particular application so dictates.

Figures 2, 10:
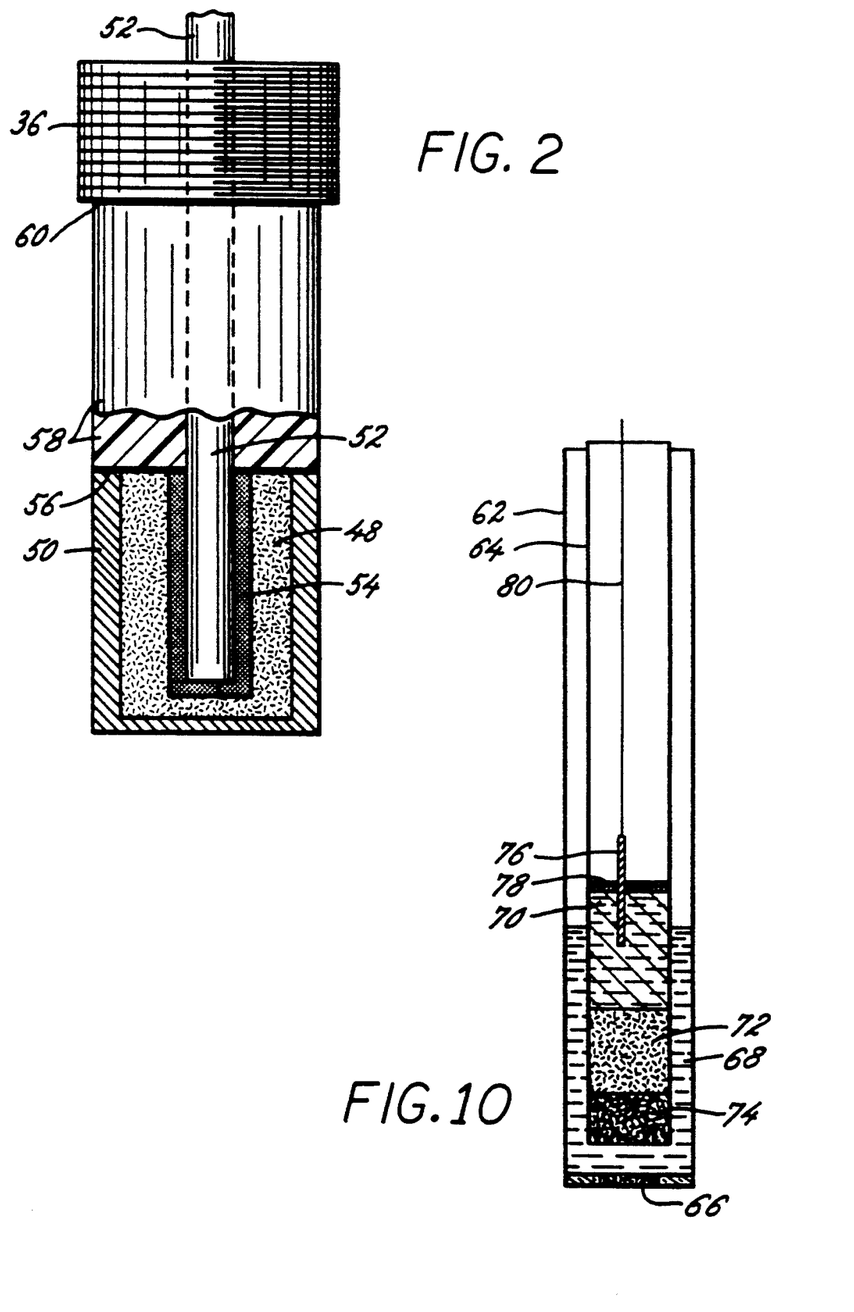
FIG. 2 is a side elevation view of a preferred embodiment of a sensor in accordance with this invention and the exterior being partially broken away to show the $PbO_2$ reference electrode and the internal construction.
FIG. 10 is a schematic view of a sensor used in determining the capacity of a sealed lead-acid battery.

FIG. 2 shows an illustrative and preferred embodiment of the sensor utilized in the battery of the present invention. In accordance with this invention, the sensor, shown generally at 34, includes a reversible reference electrode 48 which is paired with the lead plate to provide the potential indicative of the average specific gravity of the sulfuric acid electrolyte. Any reversible electrode that is stable in the sulfuric acid environment may be utilized, and a number of electrodes which satisfy this requirement are known. Thus, as illustrative examples, the reference electrode may be a lead dioxide electrode, a mercury/mercury sulfate electrode, or an oxygen electrode of the fuel cell.

In the illustrative embodiment shown in FIG. 2, the reference electrode 48 comprises a lead dioxide electrode. Because there is no lead metal in the lead dioxide electrode, the lead dioxide material will self-discharge at an extremely low rate through the following mechanism:

$$PbO_2 + H_2SO_4 \rightarrow H_2O + PbSO_4 + \tfrac{1}{2}O_2$$

Accordingly, this reference electrode will be capable of lasting in the sulfuric acid environment of the battery for a number of years. The amount of the porous lead oxide that is used can be that which should be sufficient to last over the expected battery life of the lead-acid batteries in the particular application. The specific amount needed for a particular application can be readily determined by straightforward life tests. It has been found, for example, that a reference electrode comprising two grams of $PbO_2$ should last more than two years, even when continuously exposed to a temperature of 80° F.

Alternatively, of course, the reference electrode can be charged back on a periodic basis (e.g., once a year). With this approach, the capacity indicator used in this invention can readily last the service life of the battery.

In the illustrative embodiment, the lead dioxide reference electrode is retained in an electrolyte-permeable container, such as a gauntlet 50. Any material may be used as the container for the lead dioxide reference electrode that would be suitable for use as a separator material in a lead-acid battery. As is thus apparent, the gauntlet or other container must be electrolyte permeable to provide the requisite conductivity. A variety of materials suitable as lead-acid separators are well-known. The illustrative embodiment utilizes a polyester fabric, polyester gauntlets being commonly used in tubular lead-acid batteries.

The $PbO_2$ reference electrode is in electrical contact with a current conductor. Any of a variety of materials suitable for this purpose are well-known. In the illustrative embodiment, the current conductor comprises a titanium rod 52.

When utilizing a titanium rod as the current conductor, means should be used to prevent the buildup of a titanium dioxide insulating layer between the area where the titanium rod 52 contacts the reference electrode 48, such as can relatively rapidly occur when titanium is exposed to the air, or, when used, $PbO_2$. It has been found suitable to utilize a tin dioxide coating 54 on the portion of the surface of the titanium rod 50 that contacts the $PbO_2$ reference electrode to prevent the oxidation of the titanium. Any coating, layer or the like that is electrically conducting may be used.

If desired, the gauntlet 50 can include a cover or the like to provide integrity and strength for the sensor as well as to assist in holding the titanium rod or other current conductor in position. In the illustrative embodiment shown in FIG. 2, a cover 56 for gauntlet 50 is provided for this purpose. The cover 56 for gauntlet 50 can be formed from a separate plastic material or can comprise a hot melt adhesive, such as those used in lead-acid batteries. As an illustrative example, a suitable hot melt that may be employed comprises an ethylene-propylene copolymer wherein the ratio of ethylene to propylene is 1:9.

The current collector only needs to be capable of carrying the current involved. Accordingly, the amount of material required to satisfy this objective is relatively small. While efficacious and relatively inexpensive, the resulting current collector may lack the desired durability and integrity.

Thus, according to an optional aspect of the present invention, the current collector is positioned within a protective sleeve or holder. The protective sleeve increases the integrity of the sensor and serves to protect the current collector from the corrosive environment of the lead-acid battery.

Any material that can withstand the internal environment of a lead-acid battery and provide the desired integrity may be utilized. A variety of plastic materials are thus used in conventional lead-acid batteries and may be employed for this purpose. As an illustrative example, the protective sleeve may be made of an ethylene-propylene copolymer, such as often used for automotive SLI battery containers,-covers, and the like.

To this end, and pursuant to this optional aspect of this invention, as shown in FIG. 2, plastic sleeve 58 is used. To assemble the sensor 34 so as to provide, if desired, an integral design, plastic sleeve 58 may be affixed to gauntlet 50 via the hot melt cover 56 and likewise to plastic plug 36 with a hot melt adhesive 60 or the like. Alternatively, plastic plug 36 and sleeve 58 may be integrally formed and then attached, by adhesive or other means, to container 50.

In accordance with a further aspect of the present invention, a sealed lead-acid battery may incorporate a capacity sensor as hereinbefore described. As is known, sealed lead-acid batteries are characterized by the absence of free electrolyte, i.e.—essentially all of the electrolyte is absorbed within the plates and separators. Accordingly, when used with a battery of this type, the sensor of the present invention should be designed to insure that the sensor will be in contact with the electrolyte in the plates and separators.

This may be accomplished by, for example, positioning the sensor on the top of the separators used in batteries of this type. Sufficient wicking should occur so as to, in operation, bring the reference electrode into the necessary contact with the electrolyte. Of course, if desired, the tube or other container for the reference electrode could be impregnated with the same electrolyte as used for the sealed battery itself.

The following Examples are illustrative, but not in limitation, of the present invention.

EXAMPLE 1

This Example illustrates the use of the present invention with a conventional lead-acid battery to show the capacity of such a battery under various charging, discharging and cycling conditions.

The batteries employed were commercially available Group 58G battery. These batteries were conventional, flooded-type lead-acid battery with a nominal capacity of 60 Ampere Hours.

A sensor as shown in FIG. 2 was placed in the battery for 17 months at 80° F. without any recharging. The capacity of this reference electrode was about 0.1 Ampere Hour.

Figure 3:
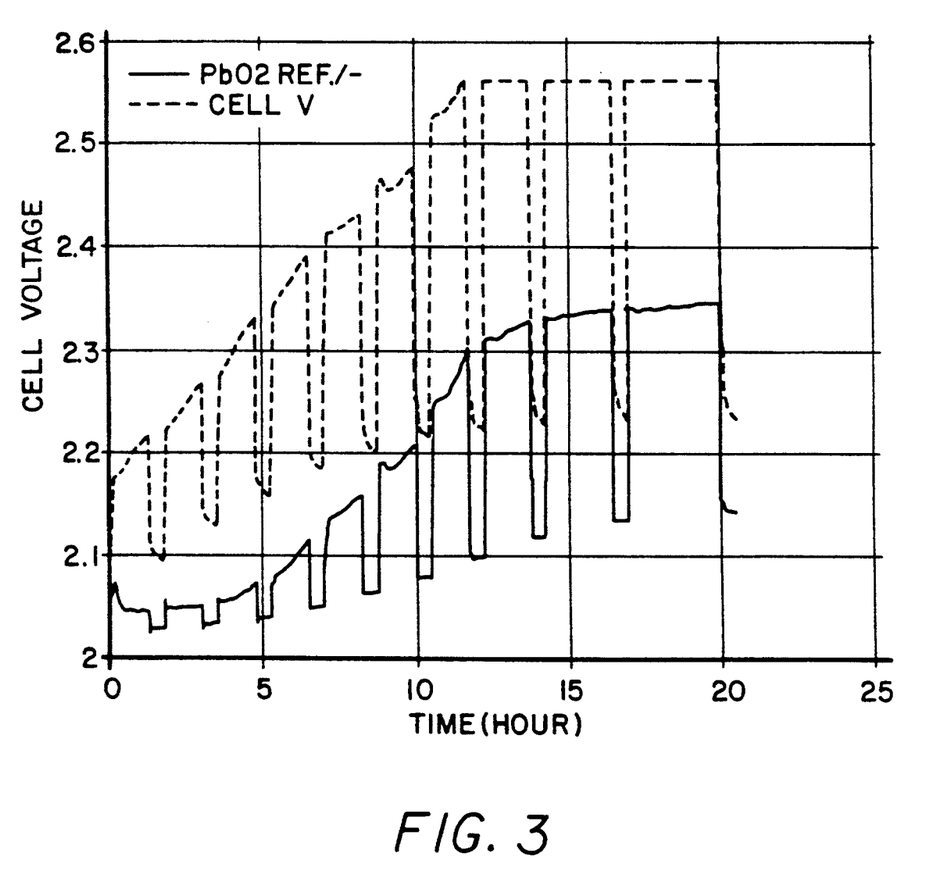
FIGS. 3–6 are graphs of voltage versus time determined in a battery according to the present invention and illustrating the use of this invention under a variety of charging and discharging conditions.
Figure 4:
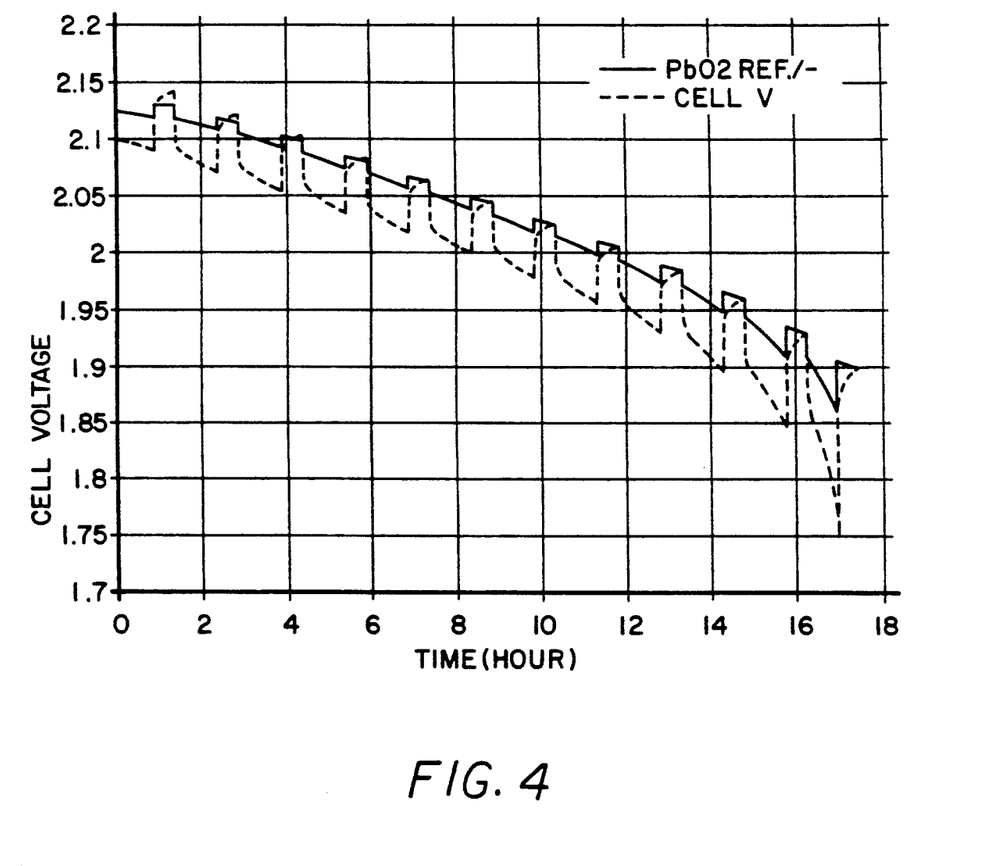
Figure 5:
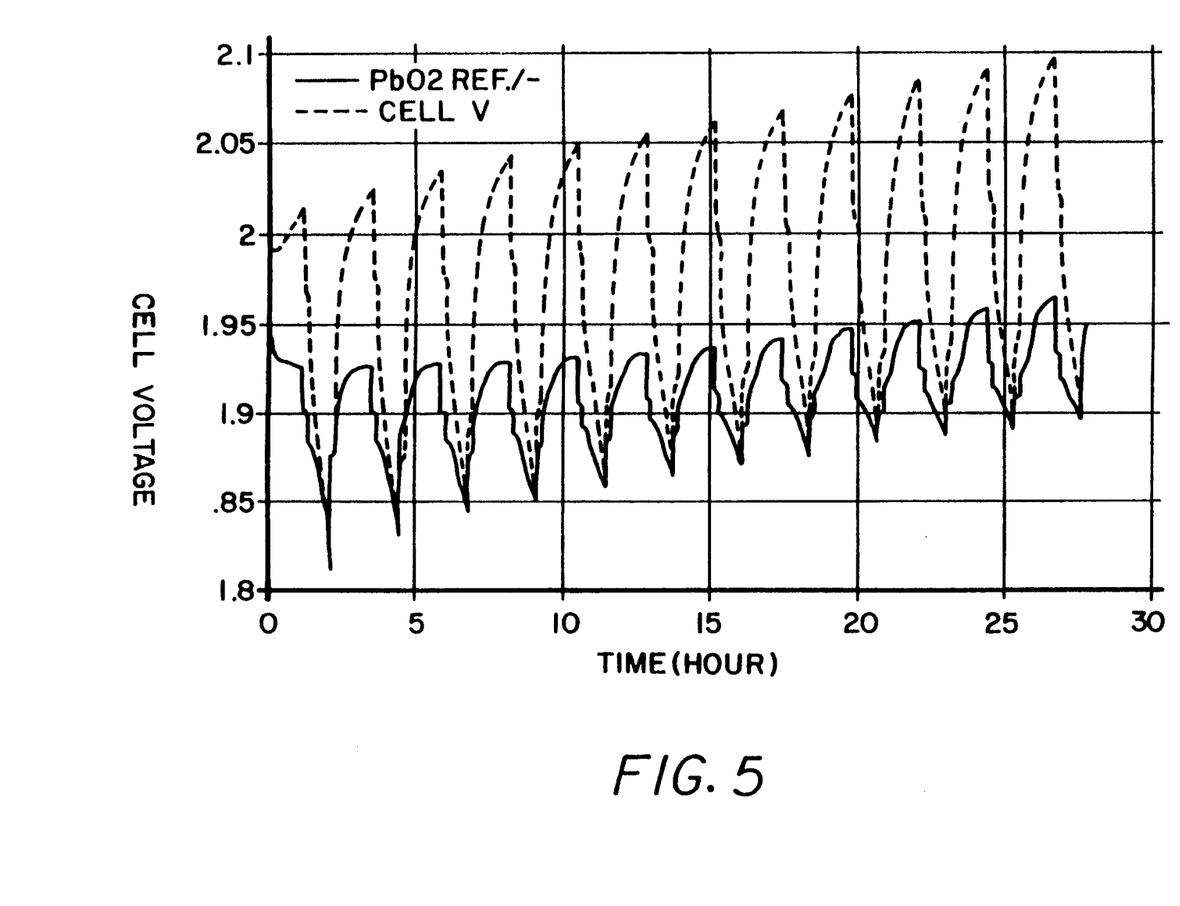
Figure 6:
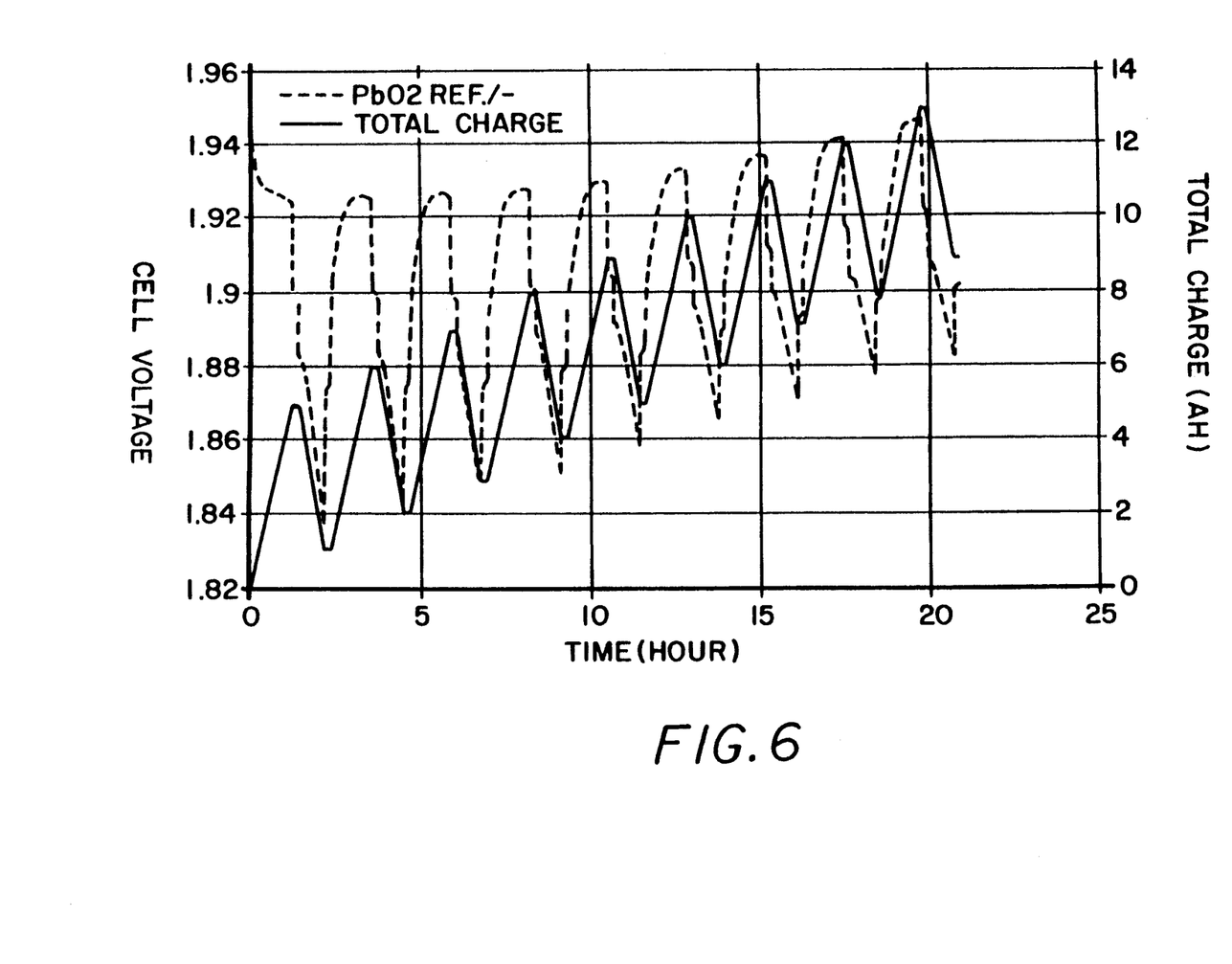

Measurements were taken by interrupting the currents for 30 minutes during a charging regime of 4 Amps (the results being shown in FIG. 3), and a 5 Amps discharging regime (the results being shown in FIG. 4), as well as under cycling conditions, 4 Amp discharging, a 10-minute rest, a 5 Amp charging, and a 10-minute rest (the results being shown in FIGS. 5 and 6). As can be seen from FIGS. 3–6, the use of the present invention provides extremely quick and reliable responses. A reliable voltage reading with an error considered to be less than about 0.01 volts can be obtained within a short minute period of time (e.g., often within seconds).

Figure 7:
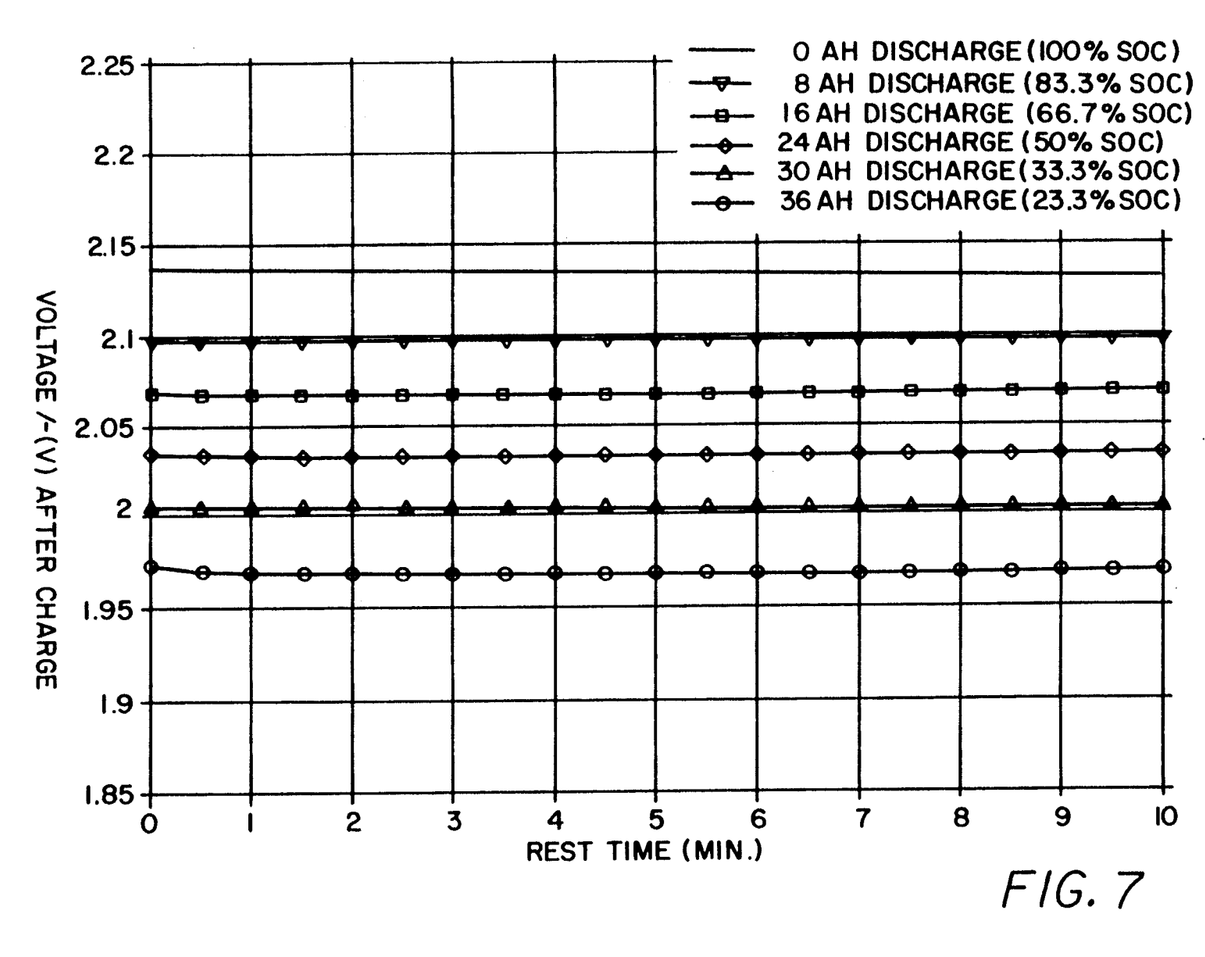
FIG. 7 is a graph of the sensor electrode-negative terminal voltage versus times and showing the essentially constant voltage determined.

To further test the response time and accuracy of this invention, a commercially available Group 58G battery was subjected to a charge-discharge cycling regime involving a cycle of 5 AH discharge at a rate of 11.5 Amps, a 10 minute rest, a 3 AH charge at a rate of 4.1 Amps and a 10 minute rest. The voltage of the sensor-negative terminal in the negative terminal cell was determined at periodic times during various cycles in the rest period following completion of the charging. The results are shown in FIG. 7. As can be seen, the use of the present invention provides a voltage that is quite constant over a period of time.

Figure 8:
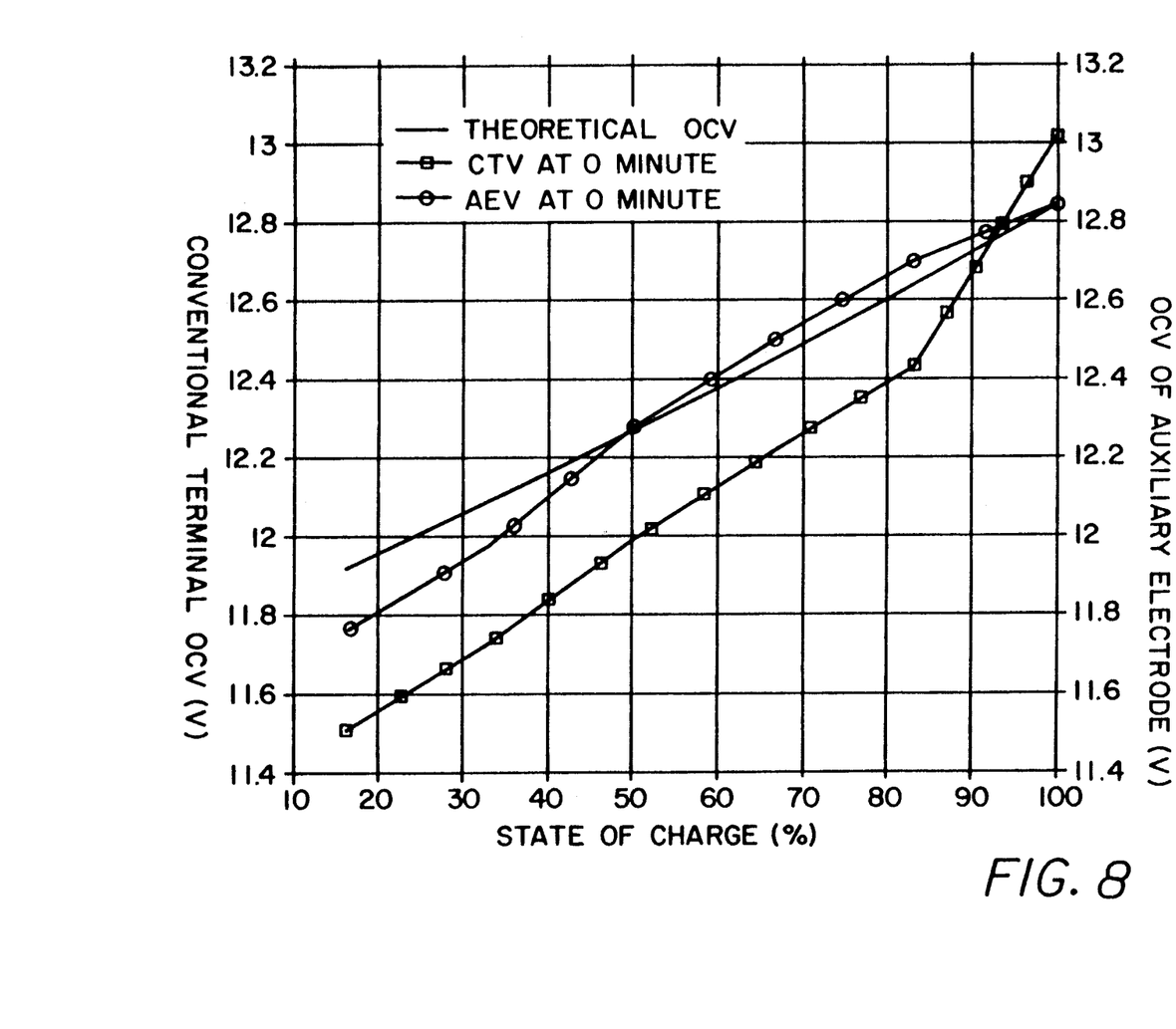
FIG. 8 is a graph of various open circuit voltages versus the state of charge and comparing such voltages with the theoretical open circuit voltage at the various states of charge.

Data obtained from this Example was also graphed to compare the results of using the conventional open circuit voltage of the battery ("CTV") and the auxiliary circuit voltage using the sensor ("AEV"; obtained by multiplying the single cell voltage experimentally noted by six) with the theoretical open circuit voltage for the battery at various states of charge. The results are shown in FIG. 8. As can be seen, the use of the battery of the present invention provides results that are quite close to the theoretical open circuit voltage as the state of charge varies while use of the actual open circuit voltage of the battery departs quite significantly from the theoretical open circuit voltage.

Figure 9:
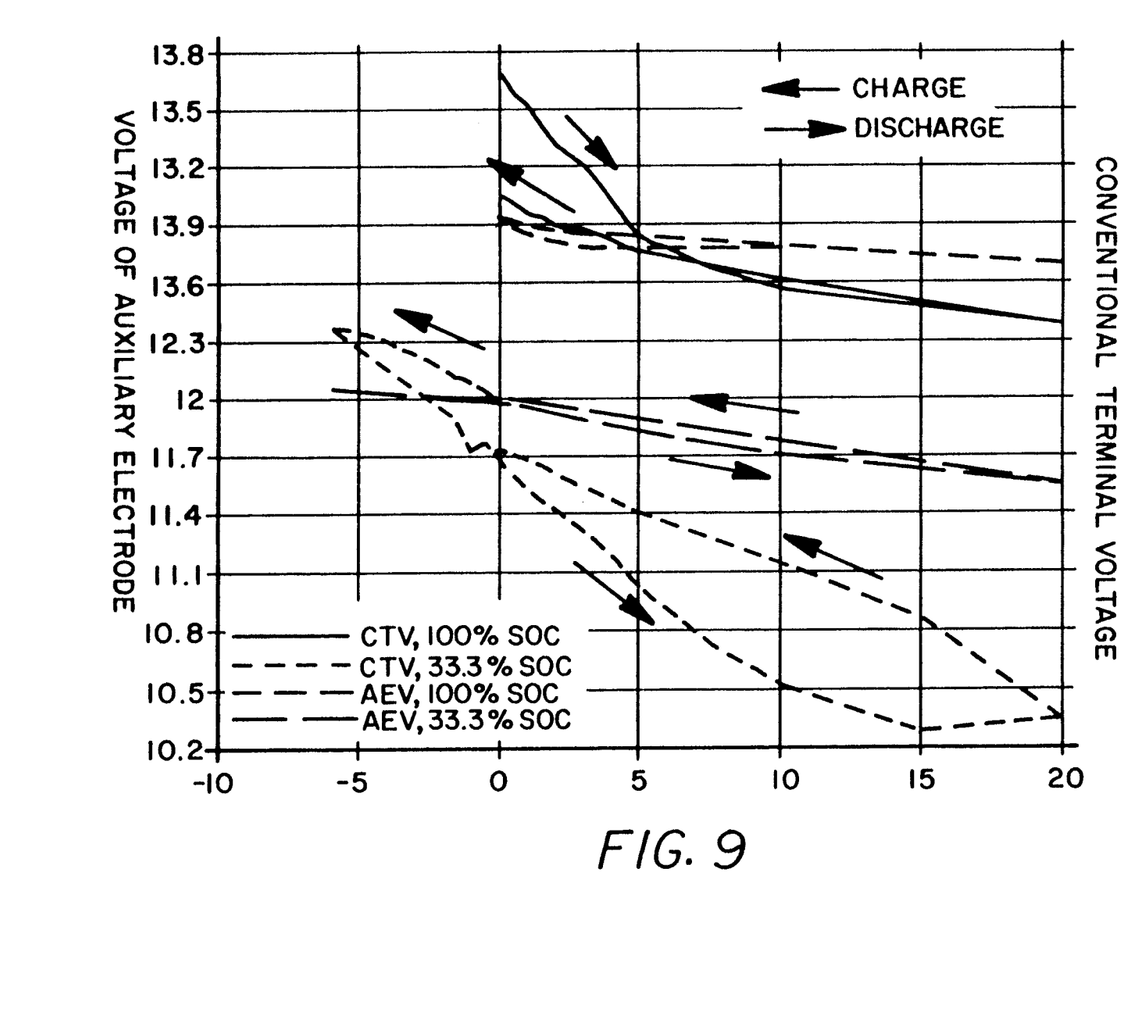
FIG. 9 is a graph showing dynamic voltage signal curves generated using the battery of this invention.

The commercially available Group 58G battery previously described was also employed to carry out dynamic measurements without interrupting the battery current while the battery was being charged or discharged. The battery was discharged at 10 amps to an assigned state of charge. Then, the battery voltage was monitored while the battery was charging and discharging. The results are shown in FIG. 9.

As can be seen, the voltage of the auxiliary electrode versus the negative terminal ("AEV") showed linear and reproducible curves, while the voltage between the positive and negative terminals ("CTV") does not. Accordingly, in this fashion, when the battery current and the AEV are known, the capacity of the battery can be determined by utilizing predetermined curves, e.g., those shown in FIG. 9.

EXAMPLE 2

This Example demonstrates the utilization of the present invention with a sealed lead-acid battery.

The sealed battery utilized was a Group 58G sealed lead-acid battery with a nominal capacity of 60 Ampere Hours.

The sensor employed a mercury/mercury sulfate reference electrode. The sensor was inserted in the battery through a vent hole and held in place by an ethylene-propylene hot melt. The sensor was positioned such that electrical contact was made with the top of the separator.

The Hg/HgSO$_4$ reference electrode used is further depicted in FIG. 10. As illustrated, the reference electrode comprises an outer glass tube 62 and an inner glass tube 64. Outer glass tube 62 included a glass frit 66 that wicked up electrolyte 68 from the battery. Mercury 70 and mercury sulfate 72 were positioned adjacent the bottom of inner tube 64 and on top of glass wool 74. A platinum wire 76 served as the current collector, and a metal-to-glass seal was also provided as shown at 78. Electrical lead 80 was used to allow the voltage to be determined and the battery tested as hereinafter described.

Figure 11:
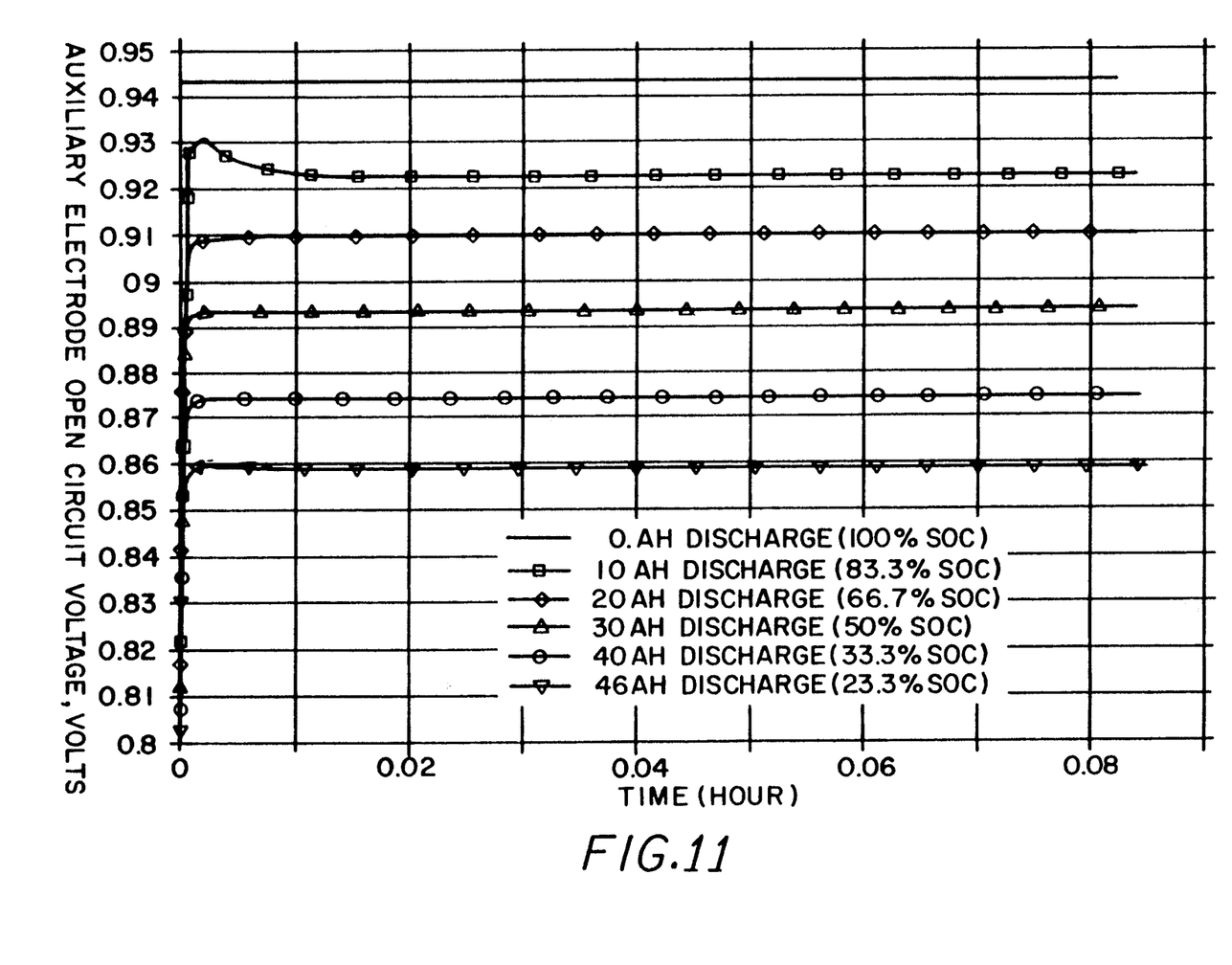
FIGS. 11 and 12 are graphs showing results using the present invention with a sealed lead-acid battery.
Figure 12:
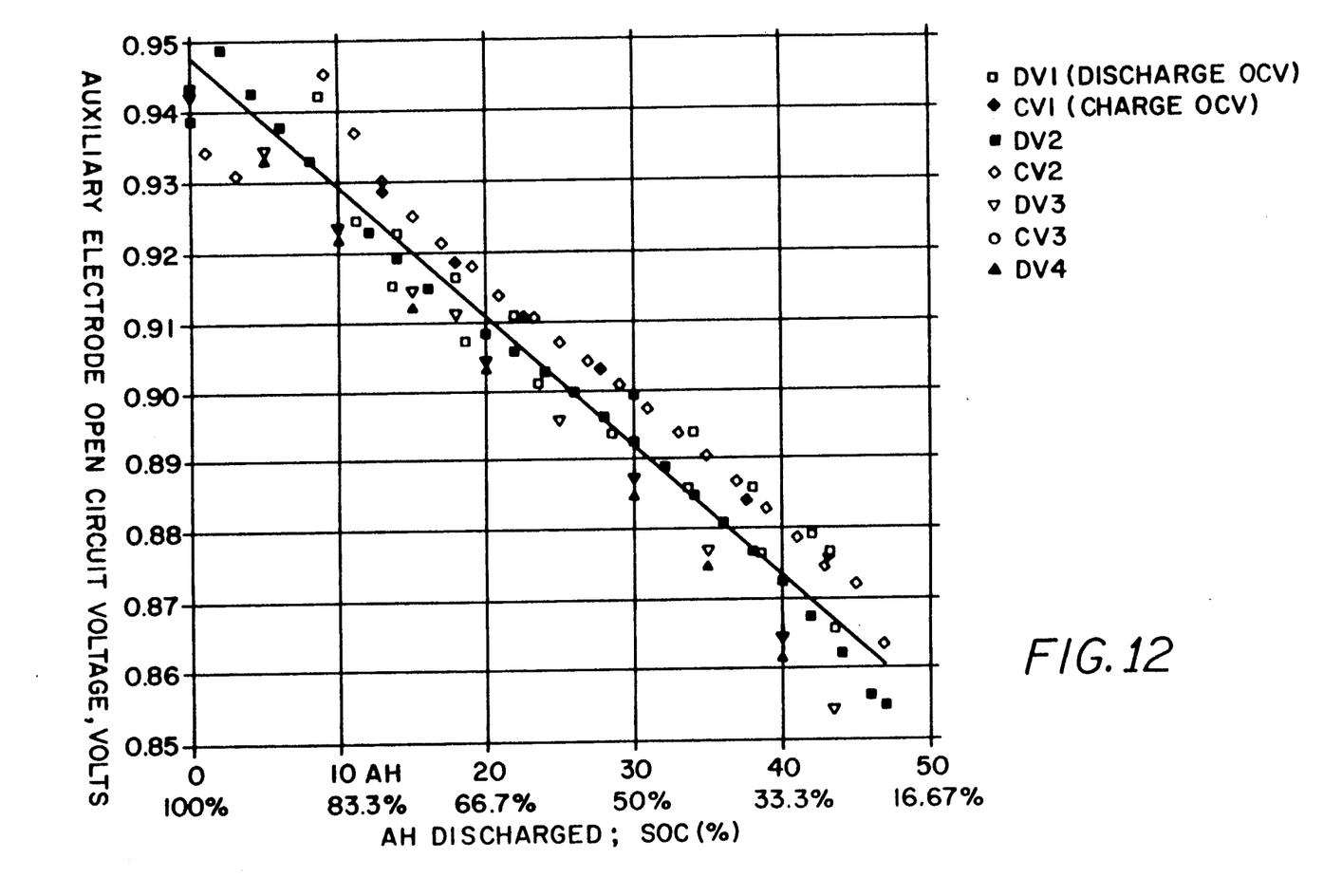

The sealed battery was tested using a computer-controlled discharge and charge unit. FIG. 11 shows the open circuit voltage of the reference electrode (i.e., the voltage of the reference electrode versus the negative terminals of the battery) after having been exposed to various levels of discharge. FIG. 12 correlates the reference open circuit voltage with the state of charge of the battery, as well as with the ampere hours ("AH") of discharge. The DV1 through DV4 data points were obtained by discharging fully charged batteries, while CV1 to CV3 data points were obtained by charging fully discharged batteries. Based upon this data, it is apparent that the capacity sensor employed with this invention may be advantageously used with sealed lead-acid batteries.

Thus, as has been seen, the present invention provides a battery in which the capacity can be determined in a very rapid and reliable fashion using the average specific gravity of the bulk electrolyte. The incremental cost of the battery capacity sensor is relatively low in comparison to many other prior solutions. Further, the use of a conductive metal oxide-coated current conductor can reduce the self-discharge rate of the reference electrode, such as lead dioxide, to a negligible degree. By utilizing the reversible lead plates, the acid concentration is averaged from the top to the bottom of the battery, even when the acid stratification is severe. Because of the reversibility of this method, the error should be much less than other prior techniques. A dynamic measurement of the battery capacity can also be done by a regime such as shown in FIG. 5, or by interrupting the current for a few seconds to obtain an open circuit voltage reading the reference electrode and the negative terminal. Importantly, the sensor utilized in the present invention is fully compatible with both a conventional, flooded type lead-acid battery as well as a sealed lead-acid battery.

Still further, the battery of the present invention provides a direct electrical signal output, indicative of the battery capacity or state of charge, which can be directly interfaced with a battery charger or an electronic instrument. This would allow, as one example, more accurate control, and, therefore, more efficient battery charging. As is evident from the results shown in FIG. 7, dynamic measurements can be made without interrupting the battery current which allow the capacity of a battery to be determined.

We claim:

1. A lead-acid battery having a capacity indicator which comprises a container, at least one partition dividing the container into cells, each of said cells including positive and negative plates and it separator positioned therebetween, one of said cells using the negative terminal cell and one being the positive terminal cell, a cover attached to said container and having at least one hole providing access to at least one of said cells, a positive terminal electrically connected to the positive plates in the positive terminal cell, a negative terminal electrically connected to the negative plates in the negative terminal cell, electrolyte contained in said cells, a reference electrode in electrical contact with the electrolyte, and electrical contact means allowing the voltage between the reference electrode and the negative plates in one cell to be determined, said voltage being indicative of the capacity of said lead-acid battery.

2. The lead-acid battery of claim 1 wherein said reference electrode is positioned in said negative terminal cell and said voltage is measured between said reference electrode and said negative terminal.

3. The lead-acid battery of claim 1 wherein said reference electrode is a $PbO_2$ electrode.

4. The lead-acid battery of claim 1 which includes a sensor comprising an electrolyte-permeable container, said reference electrode being retained in said container, a current collector in electrical contact with said reference electrode and said electrical contact means comprises electrical leads connected to said reference electrode and the negative plates in said one cell.

5. The lead-acid battery of claim 4 wherein said current collector is a titanium rod, part of said rod being in electrical contact with said reference electrode.

6. The lead-acid battery of claim 5 wherein said reference electrode is a $PbO_2$ electrode.

7. The lead-acid battery of claim 6 wherein a tin dioxide layer coats said part of said titanium rod that is in electrical contact with said reference electrode.

8. The lead-acid battery of claim 7 wherein said sensor includes a cover for said container.

9. The lead-acid battery of claim 8 wherein said sensor includes a protective sleeve surrounding part of said titanium rod.

10. The lead-acid battery of claim 9 wherein said sensor includes a plastic plug surrounding part of said titanium rode and positioned adjacent said protective sleeve.

11. The lead-acid battery of claim 10 wherein said sensor is positioned in a hole in said cover and said plastic plug is dimensioned to close off the hole.

12. The lead-acid battery of claim 11 wherein said container is of a polyester fabric.

13. The lead-acid battery of claim 11 wherein said cover is of a hot melt adhesive and attaches said protective sleeve to said container.

14. A sealed lead-acid battery having a capacity indicator which comprises a container, a plurality of alternating positive and negative plates, a porous separator positioned between adjacent positive and negative plates, electrolyte contained in said battery and absorbed in said plates and separators, a reference electrode in electrical contact means allowing the voltage between the reference electrode and at least some of the negative plates to be determined, said voltage being indicative of the capacity of said lead-acid battery.

* * * * *

UNITED STATES PATENT AND TRADEMARK OFFICE
CERTIFICATE OF CORRECTION

PATENT NO. : 5,304,433

DATED : April 19, 1994

INVENTOR(S) : JING-YIH CHERNG

BEST AVAILABLE COPY

It is certified that error appears in the above-identified patent and that said Letters Patent is hereby corrected as shown below:

ON THE TITLE PAGE:

Item: [56] References Cited
U.S. PATENT DOCUMENTS

"1,464,510 8/1923 Simpson" is missing from the U.S. references;

3,659,193 4/1972 "Pitsch" should read -- Pitsch et al. --;

4,217,645 8/1980 "Barry" should read -- Barry et al. --; and 4,417,608 11/1983 "McCartney" should read -- McCartney, Jr. et al. --.

Column 8, line 53, delete "it" and substitute therefor -- a --;

Column 8, line 54, delete "using" and substitute therefor -- being --;

Signed and Sealed this

Twentieth Day of September, 1994

Attest:

BRUCE LEHMAN

*Attesting Officer*   *Commissioner of Patents and Trademarks*